(12) United States Patent
Chung et al.

(10) Patent No.: US 7,582,494 B2
(45) Date of Patent: Sep. 1, 2009

(54) DEVICE STRUCTURES FOR REDUCING DEVICE MISMATCH DUE TO SHALLOW TRENCH ISOLATION INDUCED OXIDES STRESSES

(75) Inventors: Shine Chien Chung, Taipei Hsien (TW); David Lu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/841,791

(22) Filed: Aug. 20, 2007

(65) Prior Publication Data
US 2007/0281398 A1  Dec. 6, 2007

(51) Int. Cl.
*H01L 31/26* (2006.01)

(52) U.S. Cl. ............... 438/18; 438/11; 438/14; 438/15; 438/128; 257/47; 257/410; 257/E23

(58) Field of Classification Search ............. 438/11–18, 438/51–48, 128–130, 284–290, 275; 257/48–49
See application file for complete search history.

(56) References Cited

U.S. PATENT DOCUMENTS

| | | | |
|---|---|---|---|
| 6,828,637 B2 | 12/2004 | Kim et al. | 257/390 |
| 6,920,079 B2 | 7/2005 | Shibayama | 365/230.06 |
| 6,963,115 B2 | 11/2005 | Nakata et al. | 257/391 |
| 6,967,866 B2 | 11/2005 | Hirata et al. | 365/177 |
| 7,276,769 B2* | 10/2007 | Yamada et al. | 257/401 |
| 2004/0238900 A1* | 12/2004 | Yamada et al. | 257/401 |

OTHER PUBLICATIONS

Diaz, Carlos H., et al., "Process and Circuit Design in Terlock for Application-Dependent Scaling Tradeoffs and Optimization in the Soc Era", IEEE Journal of Solid State Circuits, vol. 38, No. 3, pp. 444-449, Mar. 2003.

* cited by examiner

*Primary Examiner*—Dung A. Le
(74) *Attorney, Agent, or Firm*—K & L Gates LLP

(57) ABSTRACT

A circuit and method are disclosed for reducing device mismatch due to trench isolation related stress. One or more extended active regions are formed on the substrate, wherein the active regions being extended from one or more ends thereof, and one or more operational devices are placed on one or more active regions, wherein the extended active region has at least a length twice as much as a distance between gates of two neighboring operational devices.

8 Claims, 6 Drawing Sheets

DEVICE STRUCTURES FOR REDUCING DEVICE MISMATCH DUE TO SHALLOW TRENCH ISOLATION INDUCED OXIDES STRESSES

BACKGROUND

The present disclosure relates generally to semiconductor design, and more particularly to device performance variation due to shallow trench isolation (STI) induced oxide layer stresses. Still more particularly, the present disclosure relates to the circuit and method of using dummy devices to eliminate the STI induced oxide layer stresses on the semiconductor operational devices, thereby eliminating operational device mismatch and increasing semiconductor performance.

In analog or high speed digital design, such as phase lock loops (PLL) circuitry, serial-deserial designs, analog-to-digital converters, or digital-to-analog converters, device matching is extremely important to attain the required circuit performance. Conventionally, the uneven device performance due to optics or others is called "proximity effect" in which the device's physical proximity in an area may affect the exposure dose during lithography. This proximity effect is more clearly shown in devices placed close to the edges. The etch rate may also be affected during the etching process due to the device's physical location. Varying either the exposure dose or the etch rate from one device to another device can result in a mismatch of device characteristics and therefore performance. This occurs because the printed figures of each device vary in size due to the varying exposure rate or etch rate. However the "Shallow Trench Isolation" (STI) process used in today's semiconductor fabrication processes often induces oxide layer stresses around the STI border. Since the STI border confines the active region therein, these oxide layer stresses result in uneven device performance near the STI border. The device mismatch is due to the "stress-incurred-by-trench-isolation effect". The devices near the edges of the "active region" have different performance levels (e.g., as represented by $I_{dsat}$) from those of the other internal devices that are farther away from the edges.

Desirable in the art of high frequency analog and digital designs are new designs that eliminate the "stress-incurred-by-trench-isolation effect" around the STI edges to further reduce device mismatch and increase semiconductor performance.

SUMMARY

In view of the foregoing, this disclosure provides a circuit and method of using larger extensions of the active region with or without multiple "dummy devices" to reduce the STI induced oxide layer stresses on the semiconductor operational devices, thereby eliminating operational device mismatch and increasing semiconductor performance.

In one example, the circuit comprises a first active region on a substrate with at least one extended active region on a first end, one or more operational devices on the first active region, wherein the extended active regions reduces the device mismatch among the operational devices.

The invention is nevertheless not intended to be limited to the details shown since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION

Figure 1:
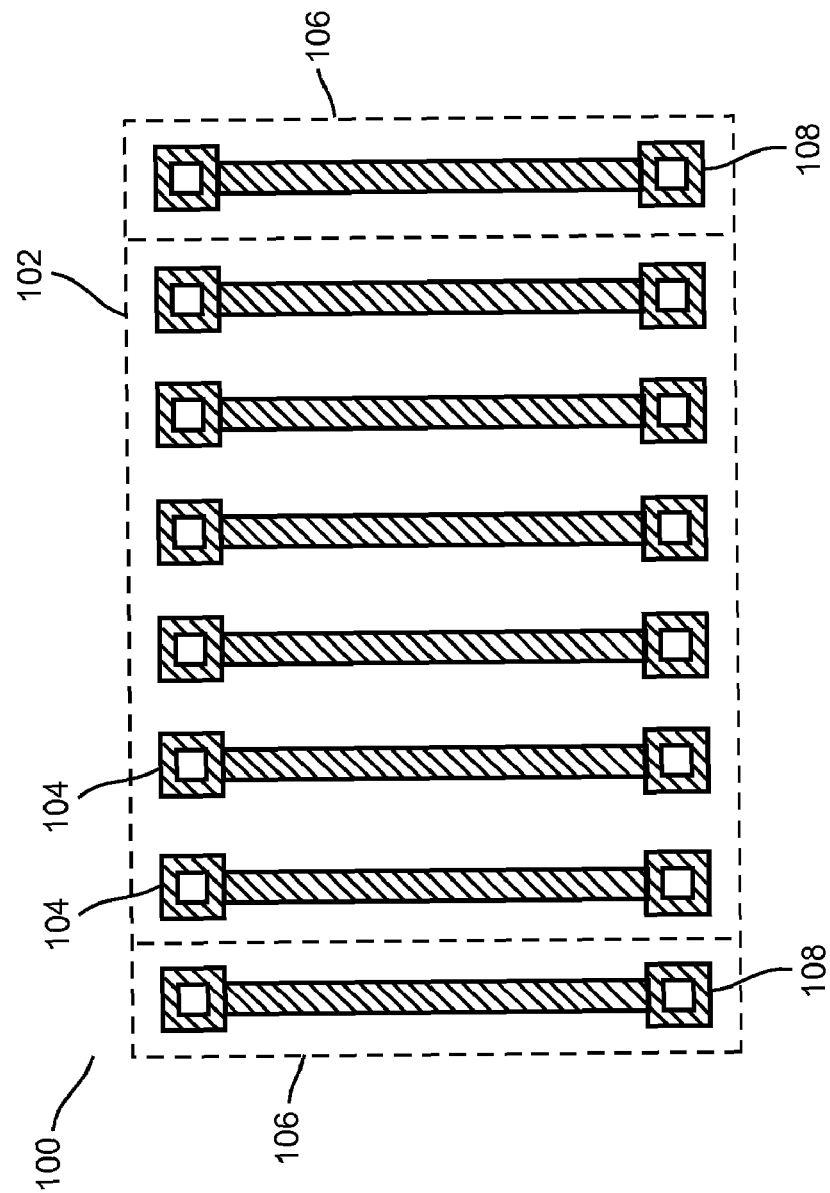
FIG. 1 illustrates a conventional method of using dummy devices for better device matching.

FIG. 1 presents a drawing 100 illustrating the conventional method of using dummy devices for better device matching. As an example, the dummy devices may be poly resistors. An area 102 contains various operational devices 104 which are precise value poly resistors that are required for proper circuit performance. By adding on each side 106 of the area 102 a dummy poly resistor 108, the proximity effects on the operational poly resistors 104 may be reduced by providing equal lithography exposure doses on these components, thereby further providing more consistent figure etching and more consistent final poly widths.

Figure 2:
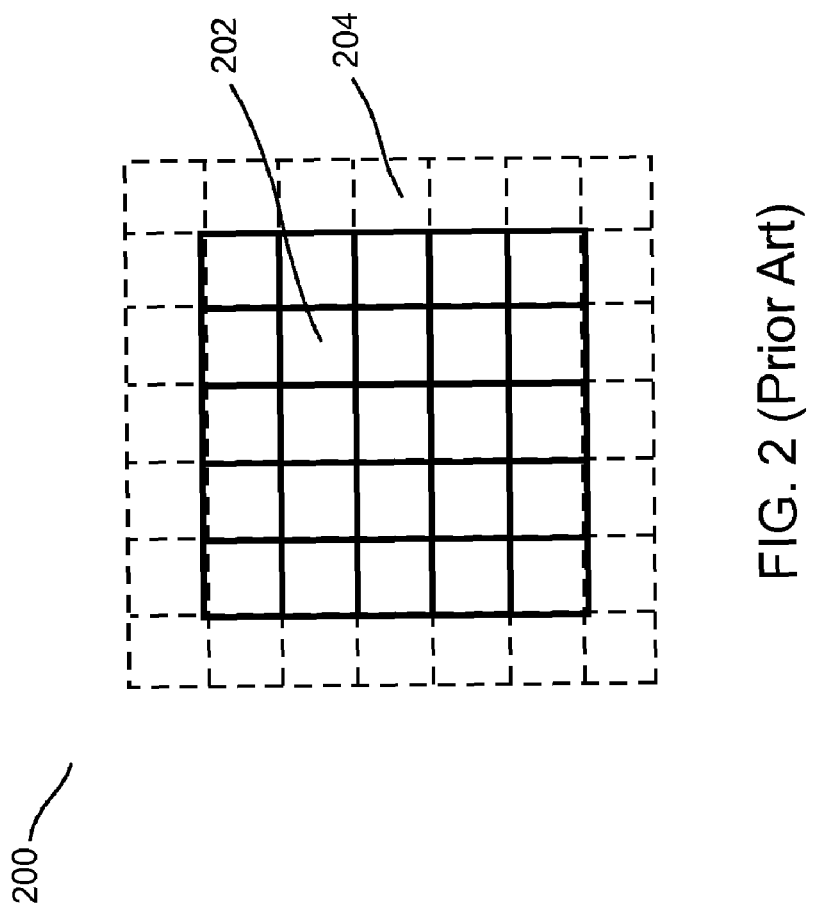
FIG. 2 illustrates the conventional method of using dummy cells in a memory array for better device matching.

FIG. 2 presents a drawing 200 illustrating the conventional method of using dummy cells in a memory cell array for better device matching. The dummy device concept can be extended into two-dimensional arrays such as memories. The active operational memory array cells 202, shown here as a 5×5 memory cell array, are surrounded by one ring of dummy cells 204 (shown as dotted cells). If the dummy cells are not implemented and the figure pitches are very close to the lithography wavelength, the figures (active region, poly, etc.) at the array edges may not receive the same exposure dose as the other internal operational cells. This would cause performance variations in the cells due to the variation in the etch rate causing variations in the final physical cell dimensions. The use of the dummy device 204 ring in this example may reduce the proximity effect on the operational memory array cells 202.

Figure 3:
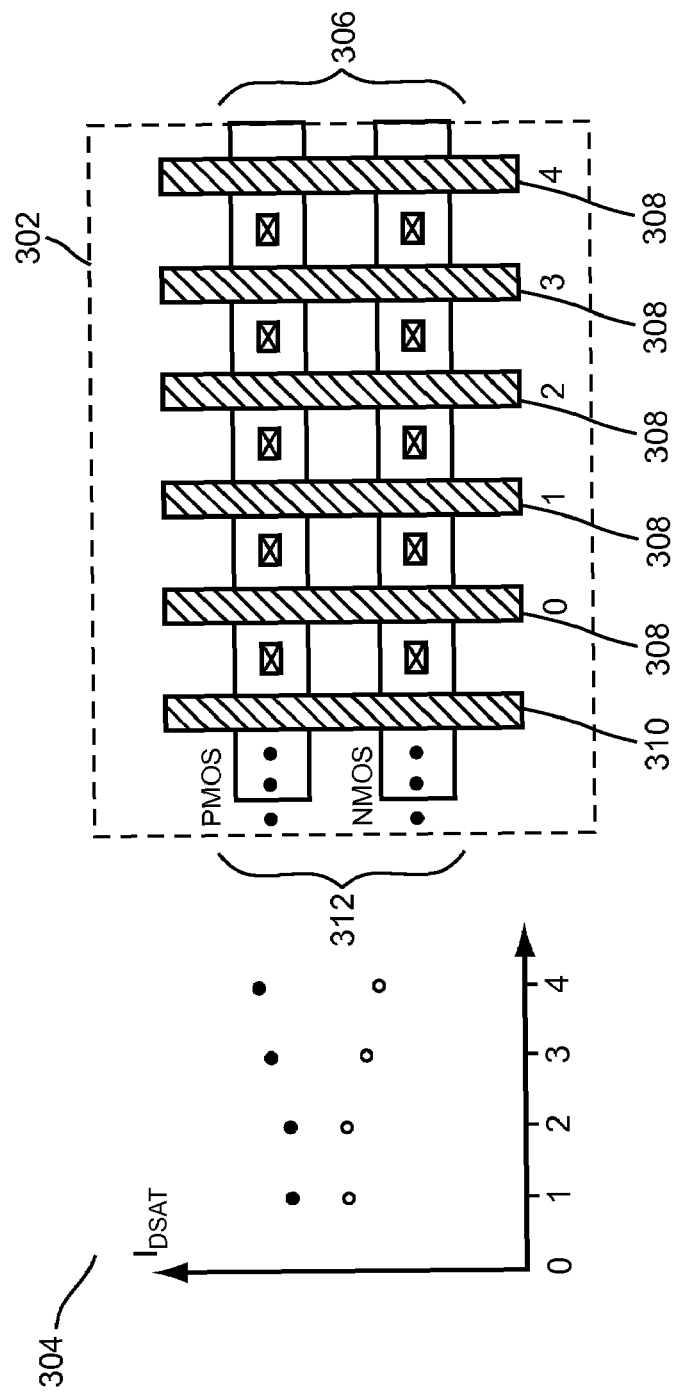
FIG. 3 is a chart and a circuit layout shows drain current saturation variation for various devices depending upon their physical location to an edge of the "active region".

FIG. 3 presents a layout 302 illustrating the physical location of a typical layout of PMOS and NMOS device pairs, as well as a graph 304 illustrating the saturation drain current $I_{dsat}$ variation for the PMOS and NMOS transistor devices (devices 0, 1, 2, 3, and 4) with respect to their physical location to an edge 306 of the "active region" ("AR").

In the layout 302, areas 308 and 310 represent the poly gate areas of PMOS and NMOS transistor pairs, and are shown to have varying distances to the AR edge 306. More devices can be placed in an internal AR area 312, but are not shown. As an example, the device #4 is the closest to the AR edge 306 and is expected to have the largest performance variation due to the "stress-incurred-by-trench-isolation effect," not due to the proximity effect. As the devices move farther from the AR edge 306, from device #4 to device #0, the performance variation due to the "stress-incurred-by-trench-isolation effect" reduces. If, for example, five dummy devices replace the operational devices #0 through #4, then all operational devices 310 to the left of device #0 of the internal AR area 312 will have minimal performance variation due to the "stress-incurred-by-trench-isolation effect."

In the graph 304, it is shown that as the devices are moved further away from the AR edge 306, i.e. from device #4 to device #0, each of the device's saturation drain current $I_{dsat}$ changes due to the "stress-incurred-by-trench-isolation effect." From device #1 to #4, the $I_{dsat}$ values for both the NMOS and PMOS devices varies more significantly as their physical locations move closer to the AR edge 306. It is noticed that this undesired non-uniformity of the device performance is caused by the stress-incurred-by-trench-isolation effect, not the proximity effect. It is this particular stress related problem that this disclosure tries to address.

Figure 4:
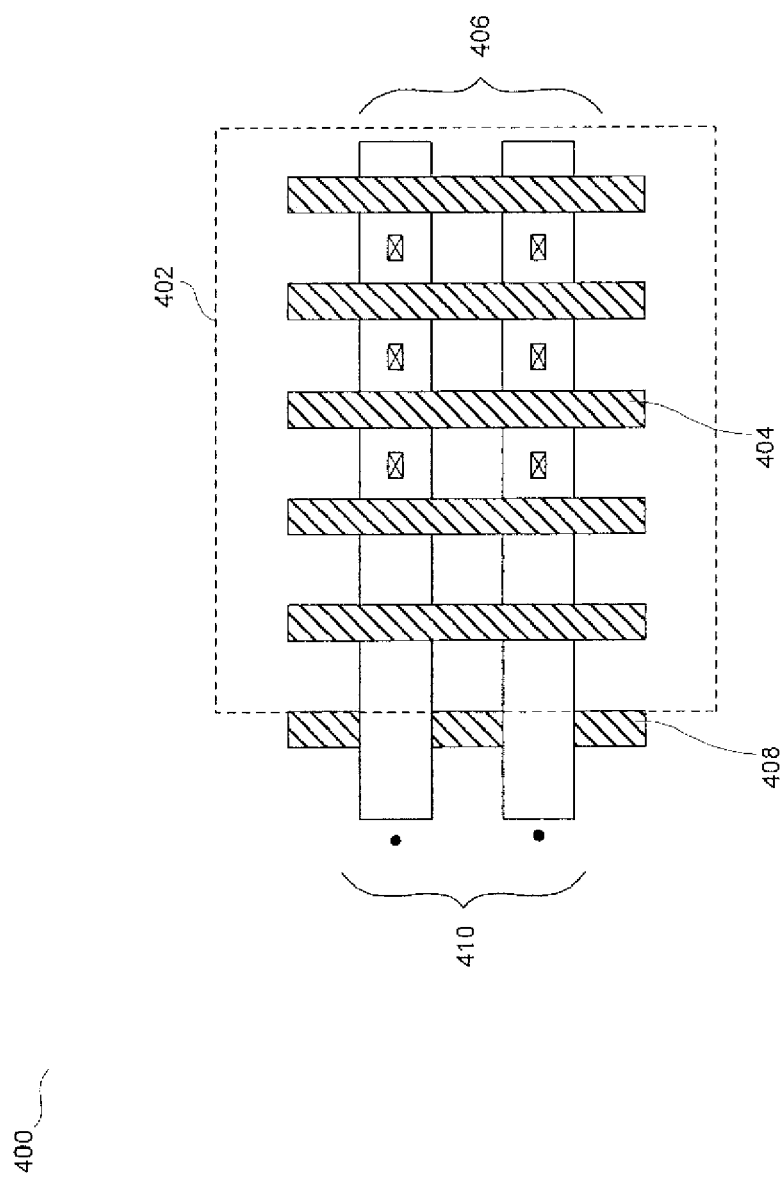
FIG. 4 presents an improved cell structure dealing with the device mismatch problem due to the "stress-incurred-by-trench-isolation effect" in accordance with a first example of the present disclosure.

FIG. 4 presents a modified cell structure 400 to solve the device mismatch due to the "stress-incurred-by-trench-isolation effect" by providing an extended AR region 402 in accordance with the first example of the present disclosure. In this embodiment, the extended AR 402 contains five dummy devices 404 that provide isolation from an AR edge 406 to eliminate operational device 408 variations due to the "stress-incurred-by-trench-isolation effect." It is noted that the length of the extended AR 402 is defined as the distance between the gate boundary of the last operational device that is closer to the edge of the AR and the edge of the AR. This length may be at least two times larger than a distance between any two parallel transistors. The distance between two parallel transistors is typically defined by the shortest distance between two neighboring gate boundary lines of two devices (or simply, the space between two poly lines). In this embodiment, it is assumed that an internal area 410 contains the operational devices 408 and other unshown devices are unaffected by the "stress-incurred-by-trench-isolation effect" due to the placement of the extended AR. In this particular example, the extended AR 402 is so large that five dummy device pairs may be added physically. In order to accommodate dummy devices, the extended AR width can be four or more times of the gate width of an operational device. Moreover, the extended AR can be implemented symmetrically or asymmetrically. In practice, it is understood that not every AR needs to be extended, and a combination of regular AR and AR with extension can be used for the best performance of the devices. It is understood that in various embodiments it is the largely the extended AR to an STI edge that provides consistent device performance while the optional dummy devices can further help reduce the device performance variations.

Figure 5:
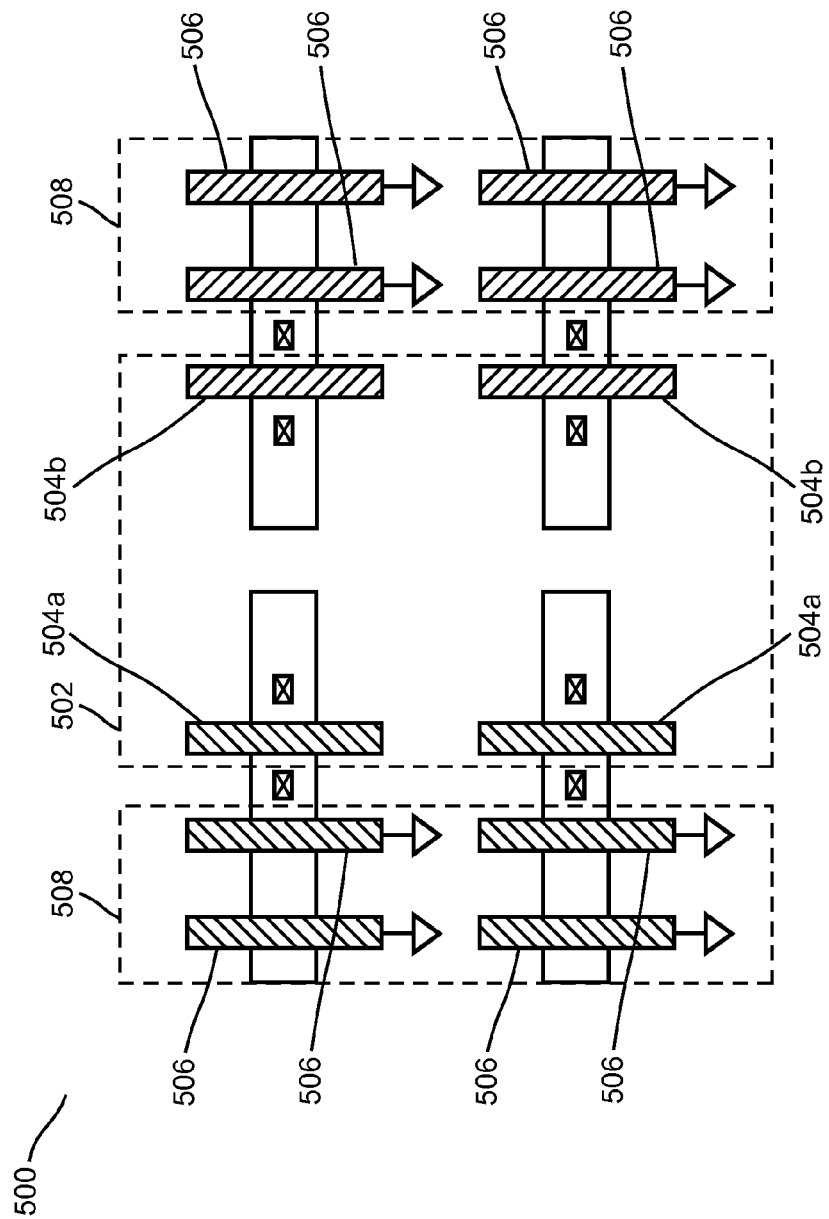
FIG. 5 presents an improved cell structure dealing with the device mismatch problem due to the "stress-incurred-by-trench-isolation effect" in accordance with a second example of the present disclosure.

FIG. 5 presents an arrangement 500 of devices to share a virtual "common centroid" with dummy devices on each AR edge to prevent the "stress-incurred-by-trench-isolation effect" from affecting the operational devices in accordance with another example of the present disclosure. This substantially symmetrical arrangement sharing the virtual common centroid is a technique to increase device matches between two devices by splitting them into many devices, placing them, and connecting them such that they share a "common center." As such, the process variation in horizontal, vertical or in any direction can be cancelled. For example, the devices 504a and 504b are split into two devices each and placed diagonally with gates, sources, and drains connected accordingly. The symmetrical structure as shown in a center region 502 with operational devices 504a and 504b provides better device matches due to the symmetry of the device arrangement. The design symmetry of the symmetrical structure cancels any gradients of process variation that adds to device mismatch. As a further reduction of device mismatches due to the "stress-incurred-by-trench-isolation effect", extended AR with or without dummy devices 506 may be implemented as shown in the areas 508. In this example, it is noted that two extended ARs with dummy devices 506 are shown for reducing the "stress-incurred-by-trench-isolation effect" on the internal operational devices 504a and 504b. It is further noted that the dummy devices 506 are grounded for NMOS. Since a static electrical charge may accumulate on the dummy devices, this charge may potentially influence the behavior of adjacent devices by electro-static modulation. However, the possibility of electro-static modulation can be eliminated by connecting the dummy devices to ground.

Figure 6:
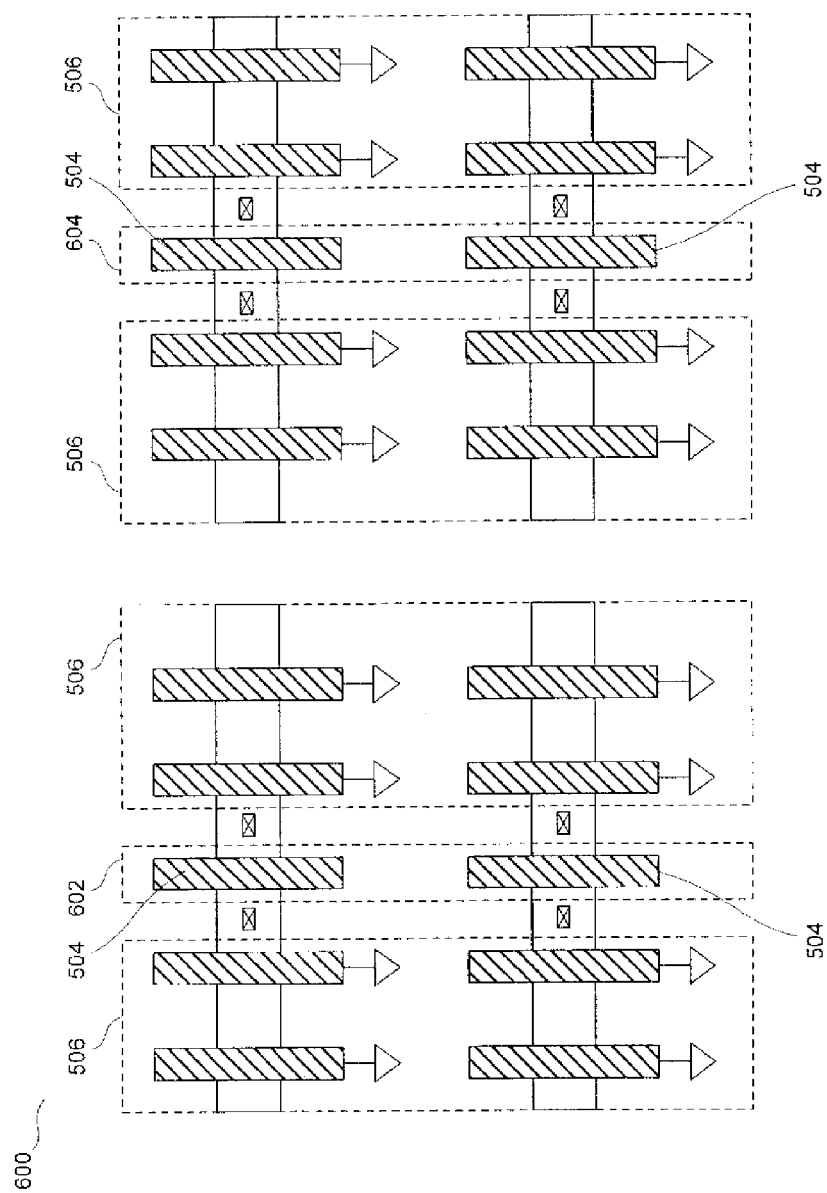
FIG. 6 presents an improved cell structure dealing with the device mismatch problem due to the "stress-incurred-by-trench-isolation effect" in accordance with a third example of the present disclosure.

FIG. 6 presents a modified symmetrical structure 600 with additional dummy devices to prevent the "stress-incurred-by-trench-isolation effect" in accordance with the third example of the present disclosure. In this example, the modified symmetrical structure 600 is similar to the symmetrical structure 500 in FIG. 5, except that the modified symmetrical structure 600 is expanded to include extended ARs (and optionally dummy devices) on both AR edges of the operational devices 504. The operational devices 504 in an area 602 represent the left half of the operational devices displayed in the symmetrical structure 502 as previously illustrated in FIG. 5. Also, the operational devices 504 in an area 604 represent the right half of the operational devices displayed in the symmetrical structure 502 as previously illustrated in FIG. 5. The addition of dummy devices 508 on both AR edges of the operational devices contained in the areas 602 and 604 allow for further reduction of the stress-incurred-by-trench-isolation effect on the operational devices 504 to further minimize device mismatch.

In the present disclosure, examples of a circuit and method of using multiple larger "active region" extensions to eliminate the STI induced oxide layer stresses on the semiconductor operational devices to improve the semiconductor performance are disclosed. Multiple dummy devices can also be used along with the active region extensions. The addition of the dummy devices can also help to reduce the proximity effect in addition to their contribution to reduce the stress-incurred-by-trench-isolation effect. It is understood that the dummy devices include some functional devices as well as non-operational devices. But the function or the operation of these devices are irrelevant or has no impact on the operation of the operational devices.

The dummy devices can be constructed of poly gate, metal gate, silicon gate, or some combinations thereof, and may be used as a resistor, ground connect, or diode. The dummy devices can connect to a fixed voltage. In some examples, the width of the dummy device is larger than that of the operational devices. When arranging the dummy devices, the spacing between any two dummy devices may be greater than the spacing between two operational devices. The above described method has been proved to be useful specifically for operational devices with a gate length of about 130 nm and below such as 100 nm, or 70 nm. In some example, a dummy gate may be constructed to cross more than two independent active regions.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A method for reducing device performance mismatch due to stress incurred by trench isolation, the method comprising:
   providing a substrate;
   forming one or more extended active regions on the substrate, wherein the extended active regions being extended from one or more ends thereof; and
   placing one or more operational devices on one or more active regions,
   wherein the extended active region has at least a length twice as much as a distance between gates of two neighboring operational devices.

2. The method of claim 1 further comprising placing one or more dummy devices in the extended active regions.

3. The method of claim 1 wherein the extended active regions are implemented on both edges of the operational devices.

4. The method of claim 1 wherein the operational devices are split and arranged in a substantially symmetrical manner to share a virtual common centroid for further reducing gradients of process variation.

5. The method of claim 4 wherein the active regions have extended active regions arranged in a center region between the split operational devices.

6. The method of claim 5 wherein one or more dummy devices are placed on the extended active regions in the center region.

7. The method of claim 1 wherein the dummy devices are tied to a grounding voltage or a fixed voltage.

8. The method of claim 1 wherein the gate of dummy devices are made of polysilicon materials.

* * * * *